US009063840B1

(12) United States Patent
Deshpande et al.

(10) Patent No.: US 9,063,840 B1
(45) Date of Patent: Jun. 23, 2015

(54) MULTIPLE MATCH DETECTION FOR MULTIPLE FLOWS IN A CONTENT ADDRESSABLE MEMORY

(75) Inventors: Chetan Deshpande, San Jose, CA (US); Sandeep Khanna, Los Altos, CA (US); Varadarajan Srinivasan, Los Altos Hills, CA (US)

(73) Assignee: Broadcom Corporation, Irvine, CA (US)

( * ) Notice: Subject to any disclaimer, the term of this patent is extended or adjusted under 35 U.S.C. 154(b) by 582 days.

(21) Appl. No.: 12/715,083

(22) Filed: Mar. 1, 2010

Related U.S. Application Data

(60) Provisional application No. 61/235,787, filed on Aug. 21, 2009.

(51) Int. Cl.
*G06F 12/00* (2006.01)
*G06F 12/02* (2006.01)

(52) U.S. Cl.
CPC .................................. *G06F 12/0207* (2013.01)

(58) Field of Classification Search
CPC ........ G11C 15/00; G11C 15/04; G11C 11/56; G11C 11/5642; G11C 15/043; G11C 15/046; G11C 29/26; G11C 29/816; G11C 7/1051; G11C 7/106; G11C 7/1066; G11C 7/12; G06F 7/74; G06F 2213/0038
USPC ................ 711/108, 128, 146, 154, 156, 162, 711/E9.06, E9.18, E12.001, E12.084, 100, 711/118, 158, 167, 202; 365/49.17, 49.18, 365/230.03, 49.1
See application file for complete search history.

(56) References Cited

U.S. PATENT DOCUMENTS

| | | | | |
|---|---|---|---|---|
| 5,852,569 | A | 12/1998 | Srinivasan et al. | 365/49 |
| 6,137,707 | A | 10/2000 | Srinivasan et al. | |
| 6,167,467 | A * | 12/2000 | Itoh et al. | 710/33 |
| 6,195,277 | B1 | 2/2001 | Sywyk et al. | 365/49 |
| 6,219,749 | B1 * | 4/2001 | Schultz et al. | 711/108 |
| 6,243,281 | B1 | 6/2001 | Pereira | |
| 6,249,467 | B1 | 6/2001 | Pereira et al. | |
| 6,275,426 | B1 | 8/2001 | Srinivasan et al. | |
| 6,317,349 | B1 * | 11/2001 | Wong | 365/49.15 |
| 6,324,087 | B1 | 11/2001 | Pereira | 365/49 |
| 6,381,673 | B1 | 4/2002 | Srinivasan et al. | |
| 6,542,391 | B2 | 4/2003 | Pereira et al. | 365/49 |
| 6,564,289 | B2 | 5/2003 | Srinivasan et al. | |
| 6,577,520 | B1 | 6/2003 | Mick | 365/49 |
| 6,687,785 | B1 | 2/2004 | Pereira | 711/108 |
| 6,693,814 | B2 * | 2/2004 | McKenzie et al. | 365/49.18 |
| 6,711,041 | B2 | 3/2004 | Pereira et al. | 365/49 |

(Continued)

*Primary Examiner* — Jared Rutz
*Assistant Examiner* — Zhuo Li
(74) *Attorney, Agent, or Firm* — Sterne, Kessler, Goldstein & Fox PLLC

(57) ABSTRACT

A CAM device including a CAM array, multiple match resolution (MMR) circuitry, and a priority encoder allows the addresses of multiple matching locations resulting from a first search operation to be generated without losing the match results generated in second search operation initiated prior to detection of the multiple match condition for the first search operation. When the multiple match condition is detected, the MMR circuitry asserts a stall signal that stalls search operations in the CAM array. The asserted stall signal also causes the match results of the first and second search operations to be stored in separate memory elements so that the addresses of all matching locations for the first search operation can be generated without disturbing the match results of the second search operation.

29 Claims, 8 Drawing Sheets

A
Initialize STALL to de-asserted state — 401
Compare first search key with data stored in CAM array and latch match results in match latches — 402
C
Latch match results in MMR circuits; forward to multiple match detection circuit and to priority encoder — 403
Determine whether there is a multiple match; Generate HPM address for search key — 404
Concurrently compare next search key with CAM data and latch results in match latch — 405
Multiple match? — 406
no
yes
B B
Assert STALL to stall search operations — 407
Provide previous match results stored in MMR latches to priority encoder; retain next match results in match latches — 408
Reset MMR latch associated with HPM CAM row — 409
Generate next HPM address — 410
more matches? — 411
yes
no
De-assert STALL to resume search operations — 412
C

(56) References Cited

U.S. PATENT DOCUMENTS

| | | | | |
|---|---|---|---|---|
| 6,748,484 | B1 * | 6/2004 | Henderson et al. | 711/108 |
| 6,751,701 | B1 | 6/2004 | Pereira | 711/108 |
| 6,795,892 | B1 | 9/2004 | Pereira et al. | 711/108 |
| 6,799,243 | B1 | 9/2004 | Pereira et al. | 711/108 |
| 6,801,981 | B1 | 10/2004 | Pereira et al. | 711/108 |
| 6,804,132 | B2 * | 10/2004 | Andersen et al. | 365/49.18 |
| 6,813,680 | B1 | 11/2004 | Pereira | 711/108 |
| 6,831,850 | B2 | 12/2004 | Pereira et al. | 365/49 |
| 6,859,378 | B1 | 2/2005 | Lin et al. | 365/49 |
| 6,865,098 | B1 | 3/2005 | Ichiriu et al. | |
| 6,924,994 | B1 | 8/2005 | Lin et al. | 365/49 |
| 6,934,795 | B2 | 8/2005 | Nataraj et al. | 711/108 |
| 6,961,810 | B2 | 11/2005 | Srinivasan et al. | |
| 7,110,407 | B1 | 9/2006 | Khanna | 370/392 |
| 7,230,840 | B2 | 6/2007 | Pereira et al. | 365/49 |
| 7,246,198 | B2 | 7/2007 | Nataraj et al. | 711/108 |
| 7,298,637 | B2 * | 11/2007 | Ma et al. | 365/49.1 |
| 7,388,768 | B2 * | 6/2008 | Hanzawa et al. | 365/233.1 |
| 7,555,593 | B1 * | 6/2009 | Rosman | 711/108 |
| 7,596,010 | B2 * | 9/2009 | Nishiyama et al. | 365/49.17 |
| RE40,932 | E | 10/2009 | Diede et al. | 711/108 |
| 2009/0168479 | A1 * | 7/2009 | Sachan et al. | 365/49.17 |

* cited by examiner

300
ML1
CLK_ML
WL1
310
D Q
CLK_MMR
321
D Q
R
320
322
SEL_MAT
RML1
ML2
WL2
RML2
MLn
WLn
RMLn

MULTIPLE MATCH DETECTION FOR MULTIPLE FLOWS IN A CONTENT ADDRESSABLE MEMORY

CROSS-REFERENCE TO RELATED APPLICATION

This application claims the benefit under 35 USC 119(e) and commonly owned U.S. Provisional Application No. 61/235,787 entitled "MULTIPLE MATCH DETECTION WHILE SEARCHING SEQUENCE OF BIT PATTERNS" filed on Aug. 21, 2009, which is incorporated by reference herein.

TECHNICAL FIELD

The present invention relates generally to multiple match detection in CAM devices, and specifically to resolving multiple matches when searching a sequence of bit patterns

BACKGROUND OF RELATED ART

A content addressable memory (CAM) device is a storage device having an array of memory cells that can be instructed to compare the specific pattern of an input string (e.g., a search key or a comparand word) with data stored in rows of the array. The entire CAM array, or segments thereof, may be searched in parallel for a match with the comparand data. If a match exists, the CAM device indicates the match condition by asserting a match flag, and may indicate the existence of multiple matches by asserting a multiple match flag. The CAM device typically includes a priority encoder that logically combines the match results to determine the highest priority matching address (e.g., the lowest matching CAM index). The highest priority matching (HPM) address, the contents of the matched location, and other status information (e.g., skip bit, empty bit, full flag, as well as match and multiple match flags) may be output from the CAM device to an output bus. In addition, associative data may be read out from an associated storage device (e.g., DRAM).

To maximize throughput, the CAM device can be configured to execute a sequence of search operations in a pipelined manner in which the search key of a next search operation is compared with the data stored in the CAM array while the priority encoder is generating the HPM address of a prior search operation. For example, in a search operation for the input string IN1="abcd" (e.g., which contains a sequence of four binary encoded characters 'a,' 'b,' 'c,' and 'd'), the first input character "a" is provided as a first search key (SK1) to the CAM array and compared with the CAM data. Then, while the priority encoder uses the match results to generate the HPM address for SK1, the second input character "b" can be provided as a second search key (SK2) and compared with the CAM data. Then, while the priority encoder uses the match results to generate the HPM address for SK2, the third input character "c" can be provided as a third search key (SK3) and compared with the CAM data. Thus, by comparing a subsequent search key with CAM data while the HPM address of a previous search key is generated, device performance is increased over other CAM devices that wait for generation of the HPM address of a prior search key before commencing a subsequent search operation.

To maintain a continuous pipeline operation in the CAM device, the priority encoder is typically configured to generate only the HPM address for each search key. As a result, if there are multiple matching CAM locations for a particular search key, the next highest-priority matching addresses (e.g., the second HPM address, the third HPM address, and so on) are not generated. However, for some applications, it is desirable to generate the addresses of multiple matching locations in the CAM array during search operations. For example, commonly-owned U.S. Pat. No. 6,564,289, which is incorporated by reference herein, discloses a method for performing a read next highest priority match (RNHPM) instruction in a CAM device. More specifically, U.S. Pat. No. 6,564,289 teaches that if a CAM device detects a multiple match condition during a compare operation, the HPM address is generated, and then a separate RNHPM instruction can be sent to the CAM device to cause the next highest priority match address to be generated. During the RNHPM operation, data stored in a column of dedicated multiple match CAM cells is compared with a predetermined logic value in a separate compare operation to generate new match results, which are then provided to the priority encoder to generate the next HPM address. Although able to generate the addresses of multiple matching locations, the CAM device disclosed in U.S. Pat. No. 6,564,289 requires an additional RNHPM instruction and an additional compare operation to generate each next HPM address. In addition, the CAM device described in U.S. Pat. No. 6,564,289 does not disclose processing a sequence of search keys in a pipelined manner, and therefore is silent as to how issuing a series of RNHPM instructions to the CAM device for a first search operation would affect an already initiated but not completed second search operation in the CAM device.

Thus, there is a need for a CAM device that can dynamically output the addresses of multiple matching locations in response to a first search operation with minimal additional latencies and without losing match results for a second search operation that commences prior to generation of multiple matching addresses for the first search operation.

BRIEF DESCRIPTION OF THE DRAWINGS

The present embodiments are illustrated by way of example and not intended to be limited by the figures of the accompanying drawings, where.

Like reference numerals refer to corresponding parts throughout the drawing figures.

DETAILED DESCRIPTION

Figure 1:
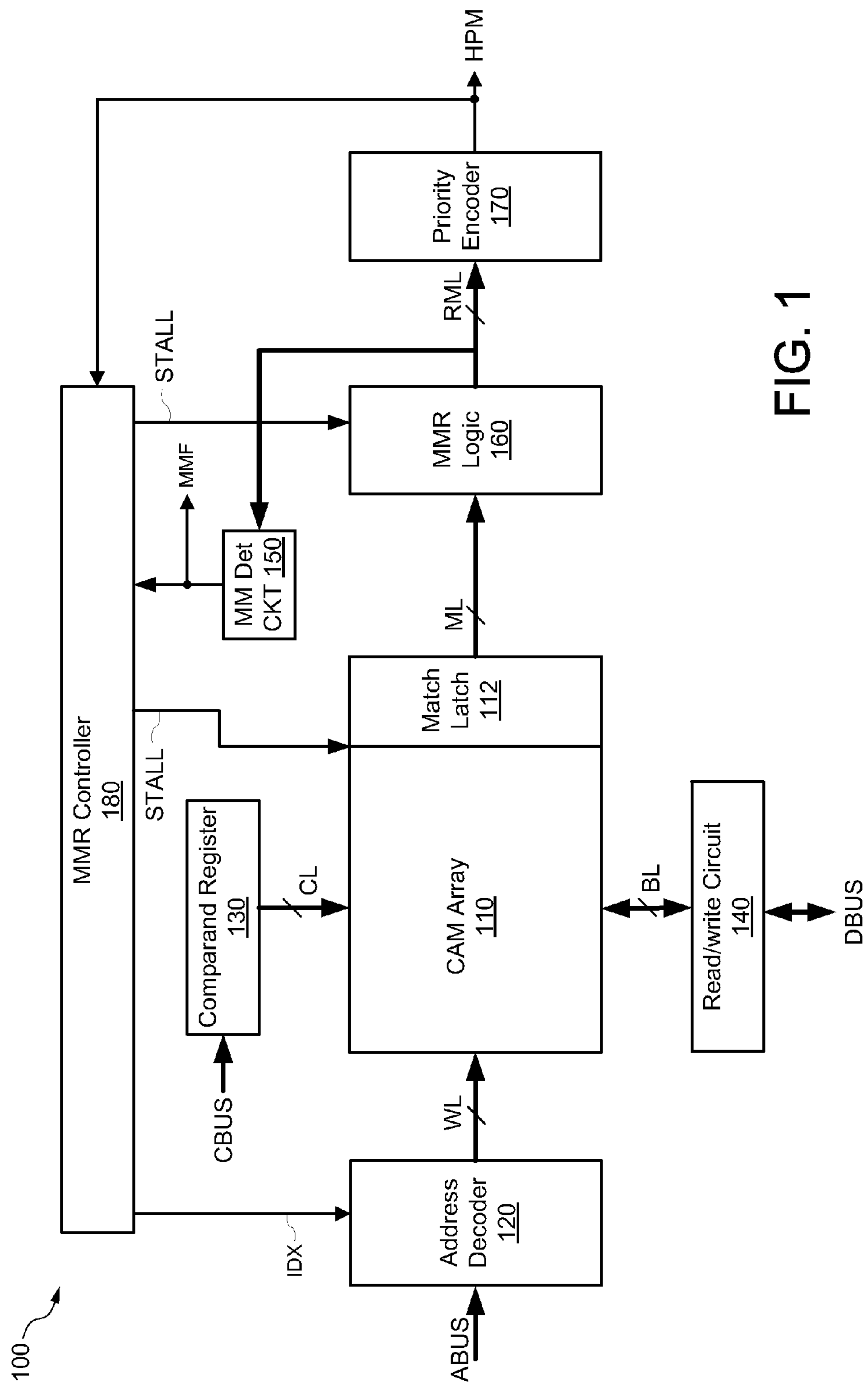
FIG. 1 is block diagram of a CAM device in accordance with some of the present embodiments.

A method and apparatus for generating addresses of multiple matching locations in a pipelined CAM device are disclosed. In the following description, for purposes of explanation, specific nomenclature is set forth to provide a thorough understanding of the present disclosure. For example, as used herein, the term search operation includes a compare portion during which a search key is compared with data stored in the CAM array, a multiple match detection portion during which the existence of a multiple match condition is determined, and an address generation portion during which the addresses of matching CAM locations are generated. For some embodiments, the multiple match detection portion and the address generation portion may overlap. However, it will be apparent to one skilled in the art that these specific details may not be required to practice the present embodiments. In other instances, well-known circuits and devices are shown in block diagram form to avoid obscuring the present embodiments unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather include within their scope all embodiments defined by the appended claims.

Embodiments described herein allow multiple matching addresses resulting from a first search operation in a CAM device to be generated for output without loss of match results from a second search operation that was commenced prior to completion of the first search operation. For some embodiments, the CAM device includes a CAM array, multiple match resolution (MMR) circuitry, and a priority encoder. The CAM array includes match latches to latch the match results of a compare operation in the CAM array, and the MMR circuitry can be configured to store the match results and provide them to the priority encoder to generate the addresses of multiple matching locations after a subsequent search operation is initiated in the CAM array. More specifically, during the compare portion of a first search operation initiated in the CAM device, first search data is compared with data stored in the CAM array to generate first match results. The first match results are captured in the match latches and forwarded to the priority encoder and to the MMR circuitry. While the multiple match detection and address generation portions of the first search operation are performed (e.g., to determine if there is a multiple match condition and/or to generate the addresses of the matching CAM locations), a second search operation is initiated in the CAM device that compares second search data with data stored in the CAM array to generate second match results. If a multiple match condition is detected for the first search operation, the MMR circuitry asserts a stall signal that stalls the second search operation and causes the MMR circuitry to forward the first match results to the priority encoder for generation of the addresses of the multiple matching CAM locations. While the second search operation is stalled, the second match results are preserved in the match latches of the CAM array, and the first match results stored in the MMR circuitry are used by the priority encoder to generate the HPM address.

For some embodiments, the HPM address generated by the priority encoder is provided back to the CAM array and used to reset a corresponding MMR latch, and then the updated MMR latch data is provided to the priority encoder to generate the address of the next HPM location. After the addresses of all matching CAM locations are generated by the priority encoder, the MMR circuitry de-asserts the stall signal, which in turn resumes the pipelined operation of the CAM device. More specifically, while the multiple match detection and address generation portions of the second search operation are performed, a third search operation is initiated in the CAM device. Thus, in contrast to the prior CAM device disclosed in U.S. Pat. No. 6,564,289, CAM devices of the present embodiments stall the second search operation and generate the addresses of multiple matching CAM entries resulting from the first search operation without additional instructions, without performing additional compare operations, and without losing the match results of the stalled second search operation.

FIG. 1 shows a CAM device 100 in accordance with the present embodiments. CAM device 100 includes a CAM array 110, a match latch 112, an address decoder 120, a comparand register 130, a read/write circuit 140, a multiple match detection circuit 150, multiple match resolution (MMR) logic 160, a priority encoder 170, and an MMR controller 180. One or more instructions and related control signals can be provided to CAM device 100 from an instruction decoder (not shown for simplicity) to control read, write, compare, initialization, and other operations for CAM device 100. Other well-known signals that can be provided to CAM device 100, such as enable signals, clock and other timing signals, and power connections, are not shown in FIG. 1 for simplicity.

CAM array 110 includes a plurality of rows, each including any number of CAM cells (not shown in FIG. 1 for simplicity) for storing a corresponding CAM word. Each row of CAM cells in array 110 is coupled to address decoder 120 via a corresponding word line WL, and is also coupled to match latch 112 and MMR logic 160 via a corresponding match line ML. For simplicity, the word lines WL and match lines ML are represented collectively in FIG. 1. Further, although not shown in FIG. 1, each row of CAM cells in CAM array 110 can include one or more validity bits to indicate whether the corresponding row (or any segment thereof) of CAM cells stores valid data. The match latch 112, which is well-known, stores match results generated by CAM array 110 during compare operations.

For some embodiments, the rows in CAM array 110 may be divided into a plurality of row segments, for example, to reduce the capacitive loading for each row and/or to provide multiple width/depth configurations for the array. For one embodiment, the segmented rows of CAM array 110 may be programmed to operate in various width and depth configurations to accommodate CAM words of varying lengths as described, for example, in U.S. Pat. No. 6,243,281, which is assigned to the assignee of the present disclosure and incorporated herein by reference. Further, although not shown in FIG. 1 for simplicity, CAM array 110 may include one or more rows of redundant CAM cells that can be enabled to functionally replace defective rows of CAM cells in CAM array 110 as described, for example, in U.S. Pat. No. 6,275,426, in U.S. Pat. No. 6,249,467, and/or in U.S. Pat. No. 6,865,098, all of which are incorporated by reference herein.

Address decoder 120 includes circuitry to select corresponding rows in CAM array 110 for read, write, and/or other operations in response to an address received from an address bus (ABUS) using the word lines WL. The address decoder 120 includes an additional input to receive an address or index (IDX) from MMR controller 180. For other embodiments, addresses may be provided to address decoder 120 from another suitable bus and/or circuitry.

The columns of CAM cells in CAM array 110 are coupled to the comparand register 130 via comparand lines CL, and are coupled to read/write circuit 140 via bit lines BL. For simplicity, the comparand lines CL and bit lines BL are represented collectively in FIG. 1. Comparand register 130 is well-known, and is configured to provide a search key or comparand word received from a comparand bus (CBUS) to CAM array 110 via the comparand lines CL for compare operations with CAM words stored therein. For other embodiments, the search key can be provided to CAM array 110 via another bus and/or circuit.

Read/write circuit 140 includes well-known write drivers to write CAM words received from a data bus (DBUS) to CAM array 110 via bit lines BL, and includes well-known sense amplifiers to read CAM words from CAM array 110 via bit lines BL onto DBUS. For other embodiments, read/write circuit 140 may be coupled to a bus other than DBUS.

MMR logic 160 includes first inputs to receive match results from match latch 112 via match lines ML, a second input to receive a stall signal (STALL) from MMR controller 180, and a plurality of outputs coupled to priority encoder 170 via resolved match lines RML. Although not shown in FIG. 1 for simplicity, MMR logic 160 includes a plurality of MMR latches that can store the match results output from match latch 112. More specifically, MMR logic 160 can store the match results of a previous compare operation performed in CAM array 110 while a next compare operation is being performed in CAM array 110, and can selectively provide either the previous match results or the next match results to priority encoder 170 in response to the signal STALL, as explained in more detail below. In this manner, MMR logic 160 can facilitate the generation of one or more next highest priority match addresses using match results stored in MMR logic 160 while the next match results are retained in the match latch 112, thereby allowing the addresses of multiple matching locations to be generated by priority encoder 170 without losing the match results for the next pipelined compare operation.

Multiple match detection circuit 150 includes inputs coupled to the resolved match lines RML, and includes an output to generate a multiple match flag (MMF) that indicates whether CAM words stored in multiple rows of CAM array 110 match the search key during a compare operation. The signal MMF is provided as an output flag, and is also provided as an input signal to MMR controller 180.

Priority encoder 170 includes inputs coupled to the resolved match lines RML and is configured to determine the matching entry that has the highest priority number associated with it and generates the index or address of this highest priority match (HPM). For some embodiments, the priority encoder 170 can use the match results to generate a match flag and/or the multiple match flag MMF. For other embodiments, the match flag can be generated by a separate match detection circuit (not shown for simplicity in FIG. 1).

The MMR controller 180 includes a first input to receive the HPM index output from priority encoder 170, a second input to receive the multiple match flag MMF from the multiple match detection circuit 150, a first output to generate the signal STALL, and a second output coupled to address decoder 120. MMR controller 180 controls the scheduling and generation of one or more next highest priority match (NHPM) addresses when there are multiple matches resulting from a particular compare operation. For some embodiments, MMR controller 180 asserts the signal STALL in response to MMF indicating that there is a multiple match condition for a first search operation, and the asserted state of STALL pauses a second search operation under way in CAM array 110 while the match results of the first search operation latched in MMR logic 160 are used by priority encoder 170 in sequential logic operations to generate the addresses of any number of the multiple matching locations.

More specifically, for embodiments of CAM device 100 configured to perform successive search operations in a pipelined manner, by the time a multiple match condition for a first search operation in CAM array 110 is detected by multiple match detection circuit 150, a second search operation has been commenced in CAM array 110. For some embodiments, the compare portion of the second search operation may be completed before the multiple match detection circuit 150 asserts MMF to indicate a multiple match condition for the compare portion of the first search operation. In response to the multiple match condition (e.g., indicated by the assertion of MMF), MMR controller 180 asserts the signal STALL (e.g., to logic high) to pause search operations in CAM device 100 while the match results of the second compare operation are latched in the match latch 112. The asserted state of STALL also causes MMR logic 160 to forward the match results of the first compare operation (which are latched in memory within MMR logic 160) to priority encoder 170, which in turn generates the address of the HPM location.

After the HPM address is generated, the MMR controller 180 may forward the HPM address to the CAM array 110 via address decoder 120 to reset the MMR latch corresponding to the HPM location, and then the updated match results stored in the MMR logic 160 may be provided to priority encoder 170 to generate the address of the next HPM location (e.g., the second highest priority matching address). After the next HPM address is generated, the MMR controller 180 may forward the next HPM address to the CAM array 110 via address decoder 120 to reset the MMR latch corresponding to the next HPM location, and then the updated match results stored in the MMR logic 160 may be provided to priority encoder 170 to generate the address of the next HPM location (e.g., the third highest priority matching address). This process is repeated until the signal STALL is de-asserted, for example, in response to multiple match detection circuit 150 indicating that no more matching entries are left. In this manner, the addresses of multiple matching locations can be generated without any additional compare operations, and without any additional compare or read instructions. This is in marked contrast to the CAM device disclosed in U.S. Pat. No. 6,564,289, which as mentioned above requires an additional RNHPM instruction and an additional compare operation for each next HPM address to be generated.

After priority encoder 170 generates the addresses of all the multiple matching locations associated with the first search operation, all the RML signals will have been de-asserted, which in turn causes multiple match detection circuit 150 to de-assert MMF. In response thereto, MMR controller 180 may de-assert the signal STALL (e.g., to a logic low state) to resume pipelined operation of CAM device 100. For some embodiments, the de-assertion of STALL causes the previously paused search operation to resume, and causes the MMR logic 160 to forward the second match results latched in match latch 112 to the priority encoder 170 for generating the HPM address(es) associated with the second search operation. In this manner, the match results of the second search operation are saved while the priority encoder 170 generates multiple matching addresses associated with the first search operation.

Figure 2:
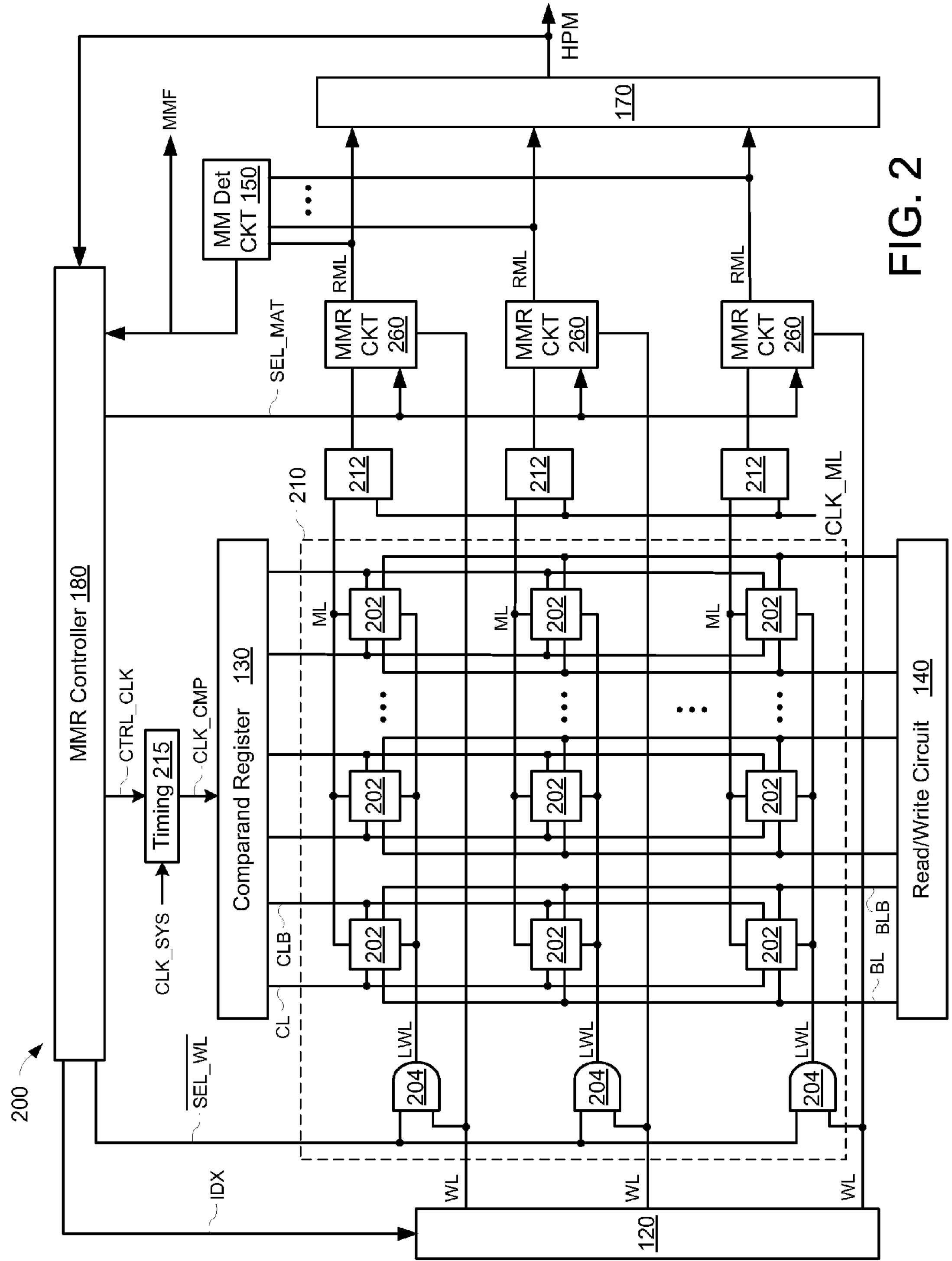
FIG. 2 is block diagram of one embodiment of the CAM array of FIG. 1.

FIG. 2 shows a portion of a CAM device 200 that is one embodiment of the CAM device of FIG. 1. CAM device 200 is shown to include a CAM array 210, match latches 212, a timing generator 215, address decoder 120, comparand register 130, read/write circuit 140, multiple match detection circuit 150, priority encoder 170, and MMR circuits 260. CAM array 210, which is one embodiment of CAM array 110 of FIG. 1, includes a plurality of AND gates 204 and a plurality of rows of CAM cells 202. CAM cells 202 can be any suitable type of CAM cell including, for example, binary, ternary, and/or quaternary CAM cells. Each row of CAM cells 202 is coupled to a corresponding local word line LWL and to a corresponding match line ML. Each local word line LWL is coupled to an output of a corresponding AND gate 204, which includes a first input coupled to the row's corresponding word line WL and a second input to receive an active low word line select signal $\overline{\text{SEL\_WL}}$ generated by MMR controller 180. The word line WL for each CAM row is also coupled to the MMR circuit 260 for the corresponding row. As explained in more detail below, each AND gate 204 selectively asserts the corresponding LWL in response to a logical combination of $\overline{\text{SEL\_WL}}$ and the corresponding WL, and can therefore assert a word line to access the corresponding MMR circuit 260 without asserting the corresponding local word line. Each column of CAM cells 202 is coupled to the comparand register 130 via a complementary comparand line pair CL/CLB, and to the read/write circuit 140 via a complementary bit line pair BL/BLB.

The comparand register 130 provides complementary comparand data to columns of CAM cells 202 via the comparand line pairs CL/CLB. Further, comparand register 130 includes a control input to receive a compare clock signal (CLK_CMP) generated by timing generator 215, which includes a first input to receive a system clock (CLK_SYS) and a second input to receive a clock control signal (CTRL_CLK). The clock signal CLK_CMP controls the clocking of the search key from comparand register 130 to the CAM cells 202 via CL/CLB for compare operations in response to CLK_SYS, and CTRL_CLK can be used to pause or block CLK_CMP, as explained in more detail below. Although the comparand data present on a comparand line pair are generally referred to herein as being complementary comparand signals, a comparand line pair CL/CLB may be driven to the same logic state (e.g., logic low or high) to mask compare operations within an entire column of the CAM array 210. The read/write circuit 140 provides/receives complementary CAM data to the columns of CAM cells 202 via the bit line pairs BL/BLB. For other embodiments, the complementary comparand lines CL/CLB may be replaced by single-ended comparand lines, and/or the complementary bit lines BL/BLB may be replaced by single-ended bit lines. In addition, for other embodiments, the comparand lines can be omitted, and the bit lines can be used to provide comparand data to the CAM array for compare operations. For alternate embodiments, encoded comparand data can be provided to the CAM array for search operations, for example, as described in commonly-owned U.S. Pat. No. 7,133,302.

Match latches 212, which together form one embodiment of match latch 112 of FIG. 1, each have a first input coupled to the match line of a corresponding row of CAM cells 202, a second input to receive a match latch clock signal (CLK_ML), and an output coupled to a corresponding MMR circuit 260. Match latches 212 can be any suitable type of storage cell. For some embodiments, each match latch 212 is a flip-flop having a clock input to receive CLK_ML.

MMR circuits 260, which together form one embodiment of MMR logic 160 of FIG. 1, each have a first input coupled to the output of a corresponding match latch 212, a second input to receive a select match data signal (SEL_MAT), and an output coupled to priority encoder 170 via a corresponding resolved match line RML. For some embodiments, each MMR circuit 260 includes an MMR latch (not shown for simplicity) to store match data, and also includes control logic to selectively forward either match data stored in match latch 212 or match data stored in the MMR latch to the priority encoder 170 in response to the signal SEL_MAT.

Figure 3:
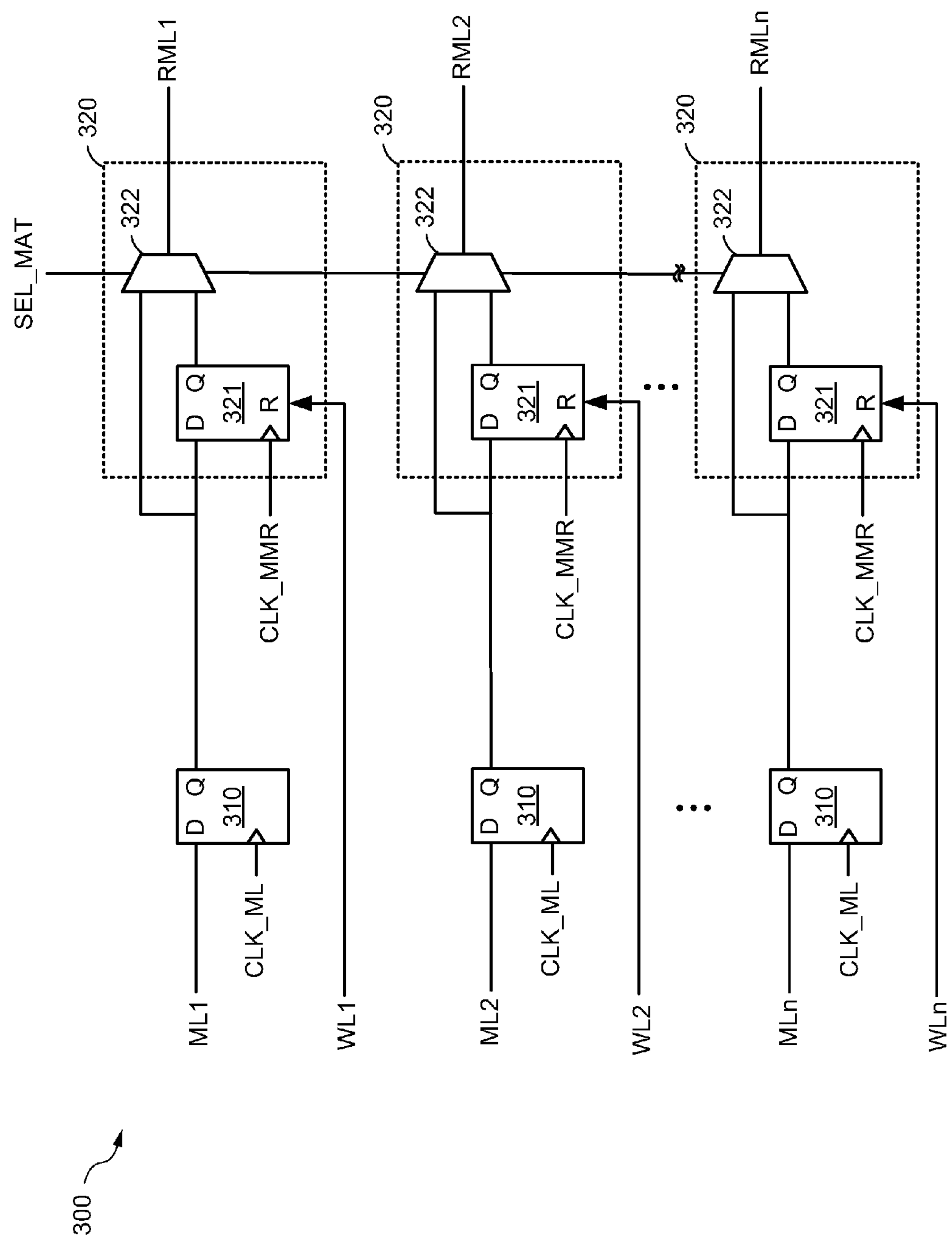
FIG. 3 is a circuit diagram of one embodiment of the match latches and multiple match resolution (MMR) circuits of FIG. 2.

For example, FIG. 3 shows a circuit 300 that includes match latches 310 and MMR circuits 320. Each match latch 310, which is one embodiment of match latch 212 of FIG. 2, is a flip-flop having a data input (D) coupled to the corresponding match line ML, a clock input (<) to receive CLK_ML, and a data output (Q) coupled to the corresponding MMR circuit 320. Each MMR circuit 320, which is one embodiment of MMR circuit 260 of FIG. 2, includes an MMR latch 321 and a multiplexer (MUX) 322. Each MMR latch 321 is shown as a flip-flop having a data input (D) coupled to the Q output of the corresponding match latch 310, a clock input (<) to receive an MMR clock signal CLK_MMR, a reset input (R) coupled to a corresponding word line WL, and a data output (Q). MUX 322 includes a first input coupled to the Q output of match latch 310, a second input coupled to the Q output of MMR latch 321, a control terminal to receive the signal SEL_MAT, and an output coupled to the resolved match line RML.

Referring to both FIGS. 2 and 3, the signals $\overline{\text{SEL\_WL}}$, CTRL_CLK, and SEL_MAT together form one embodiment of the signal STALL that is generated in response to the multiple match flag signal MMF output by multiple match detection circuit 150. Thus, for some exemplary embodiments described herein, the logic state of STALL can be used to control the logic states of signals $\overline{\text{SEL\_WL}}$, CTRL_CLK, and SEL_MAT.

An exemplary operation of CAM device 100 is described below with respect to the illustrative flow chart of FIGS. 4A and 4B. Initially, the MMR controller 180 initializes the signal STALL to a de-asserted state (e.g., logic low), which in turn de-asserts signal $\overline{\text{SEL\_WL}}$ to logic high, and de-asserts signals CTRL_CLK and SEL_MAT to logic low (401). The de-asserted state of CTRL_CLK allows timing generator 215 to provide the compare clock signal CLK_CMP to the CAM array 210 in response to CLK_SYS, and the de-asserted state of SEL_MAT causes MUX 322 to route the output signal from match latch 212 to priority encoder 170 via the resolved match line RML. Then, a first search operation is initiated during which a first search key is provided to CAM array 210 and compared with data stored therein using CLK_CMP, and the match results are latched in match latches 212 (402). For each row of CAM cells in the array that matches the search key, a logic high value is latched in the corresponding match latch 212. Conversely, for each row of CAM cells in the array that does not match the search key, a logic low value is latched in the corresponding match latch 212. For some embodiments, the match results are latched in match latches 212 on a trigger edge of CLK_ML.

Next, the match results are latched in the MMR circuits 260, and then forwarded to multiple match detection circuit 150 and to priority encoder 170 (403). For some embodiments, the match results are latched in the MMR circuits 260 on a trigger edge of CLK_MMR, which for some embodiments can be controlled by MMR controller 180. Multiple match detection circuit 150 begins determining whether there is a multiple match condition using the latched match results, and priority encoder 170 begins generating the HPM address using the latched match results (404).

At the same time, a second search operation is initiated during which a second search key is provided to and compared with the data stored in the CAM array, and the corresponding second match results are latched in the match latches 212 (405). If there is not a multiple match condition detected for the compare portion of the first search operation, as tested at 406, multiple match detection circuit 150 does not assert the signal MMF, and processing continues at 403.

Conversely, if there is a multiple match condition detected for the first search key, as tested at 406, multiple match detection circuit 150 asserts the signal MMF, which in turn causes MMR controller 180 to assert the signal STALL (e.g., to logic high) to stall search operations in the CAM array (407). For the exemplary embodiment of FIG. 2, the asserted state of STALL asserts CTRL_CLK to logic high, which causes timing generator 215 to pause (e.g., gate or block) the compare clock signal CLK_CMP to prevent subsequent comparand data from being provided to the CAM array, thereby stalling search operations in the CAM device. The asserted state of STALL also enables the MMR circuits 260 to forward the previous match results stored in the MMR latches (e.g., of the first search operations) to priority encoder 170 and prevents match latches 212 from forwarding the next match results (e.g., of the second search operations) to priority encoder 170, thereby retaining the next match results in the match latches 212 while the multiple HPM addresses associated with the first search operation are generated (408). For the exemplary embodiment of FIGS. 2 and 3, MMR controller 180 asserts the signal SEL_MAT (e.g., to logic high) so that MUXes 322 select the match data from MMR latches 321 as input data to priority encoder 170 and to multiple match detection circuit 150 via the resolved match lines RML.

Thereafter, MMR controller 180 uses the HPM address generated by priority encoder 170 to reset (e.g., from logic high to logic low) the MMR latch 321 for the CAM row associated with the HPM address (409). As a result, only the next highest-priority matching CAM rows still have a logic high value stored in their corresponding MMR latches. For the exemplary embodiment of FIGS. 2 and 3, MMR controller 180 asserts signal $\overline{\text{SEL\_WL}}$ to logic low, and provides the HPM address generated by priority encoder 170 to address decoder 120 as the index IDX. In response thereto, address decoder 120 decodes IDX and asserts the corresponding word line WL, which in turn drives the reset terminal (R) of the corresponding MMR latch 321 to logic high and thereby forces the MMR latch output Q to a logic low state. Note that the asserted logic low state of $\overline{\text{SEL\_WL}}$ forces the outputs of AND gates 204 to logic low, thereby preventing the word line WL asserted in response to IDX from driving the corresponding local word line LWL to logic high. In this manner, asserting the word line WL to reset the MMR latch of the HPM CAM row does not enable the corresponding row of CAM cells in the array for read/write operations, thereby preventing read and write disturb for the CAM data during RNHPM operations performed by MMR controller 180 and MMR circuits 260.

For other embodiments, MMR latches 321 can be addressable memory cells such as SRAM or DRAM cells, and an associated write circuit (not shown for simplicity) can be used to update match results stored therein after generation of each HPM address.

Then, the updated match results in the MMR latches 321 are provided to priority encoder 170 via MUXes 322 and resolved match lines RML, and the priority encoder 170 generates the address of the next highest-priority matching CAM row (410). The multiple match detection circuit 150 updates the MMF in response to the updated match signals on RML. If there are more matching CAM rows, as tested at 411 (e.g., if the MMF continues to be asserted by multiple match detection circuit 150), processing continues at 409 until the addresses of all matching CAM rows are generated and output by priority encoder 170. Otherwise, if there are not any more matching CAM rows, as indicated at 411 by the de-assertion of MMF by multiple match detection circuit 150, MMR controller 180 de-asserts the signal STALL to resume search operations in the CAM array (412), and processing continues at 403.

For the exemplary embodiment of FIGS. 2 and 3, the de-asserted state of STALL de-asserts CTRL_CLK to logic low, which causes timing generator 215 to resume the compare clock signal CLK_CMP to allow subsequent comparand data to be provided to the CAM array, thereby resuming search operations in the CAM device. The de-asserted state of STALL also allows the next match results latched in match latches 212 to be provided to priority encoder 170 via MUXes 322 (e.g., by de-asserting SEL_MAT to logic low).

Figure 4A:
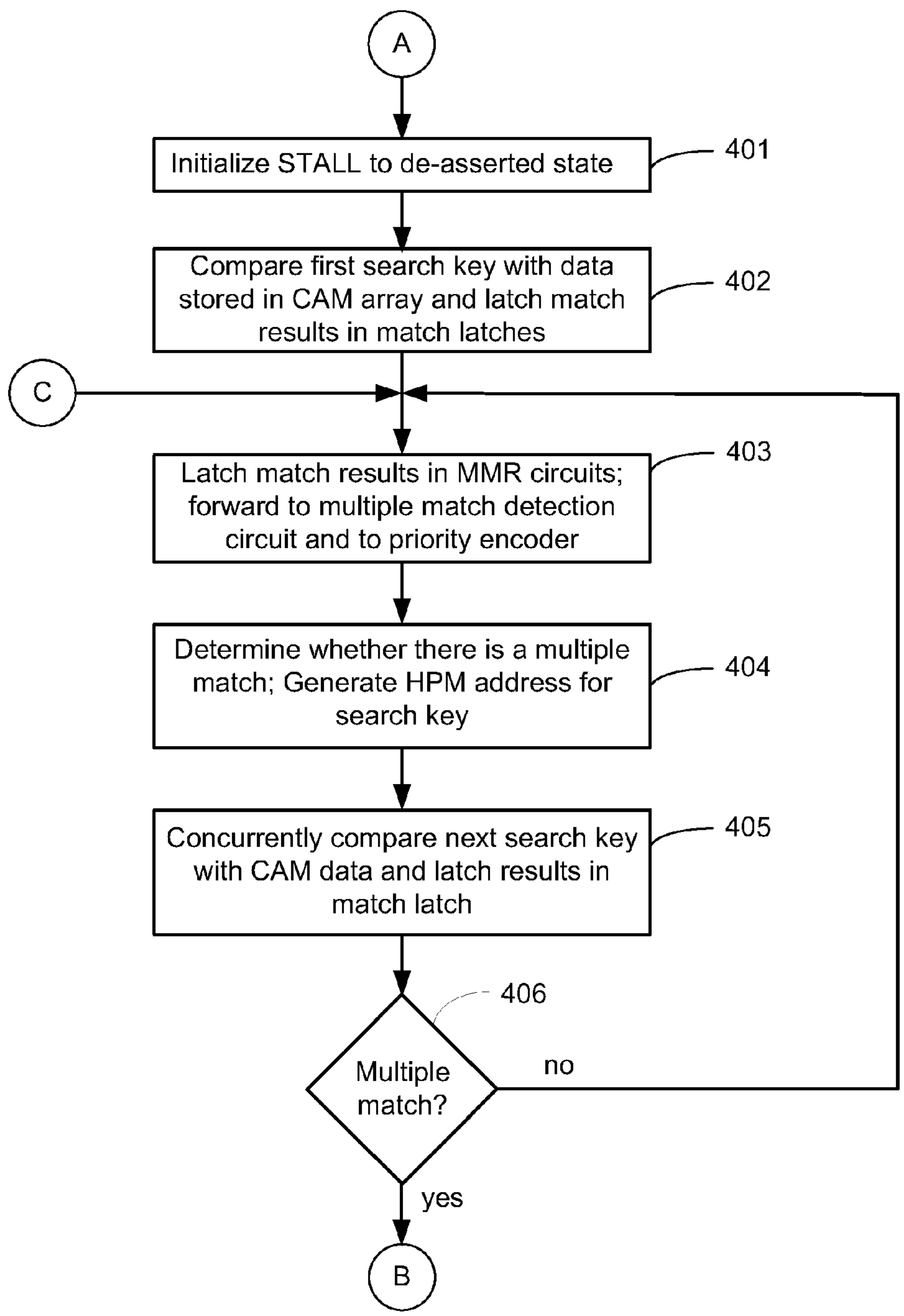
FIGS. 4A and 4B illustrate an exemplary operation for generating the addresses of multiple matching CAM locations for a first search operation after a second search operation has been commenced in the CAM array.
Figure 4B:
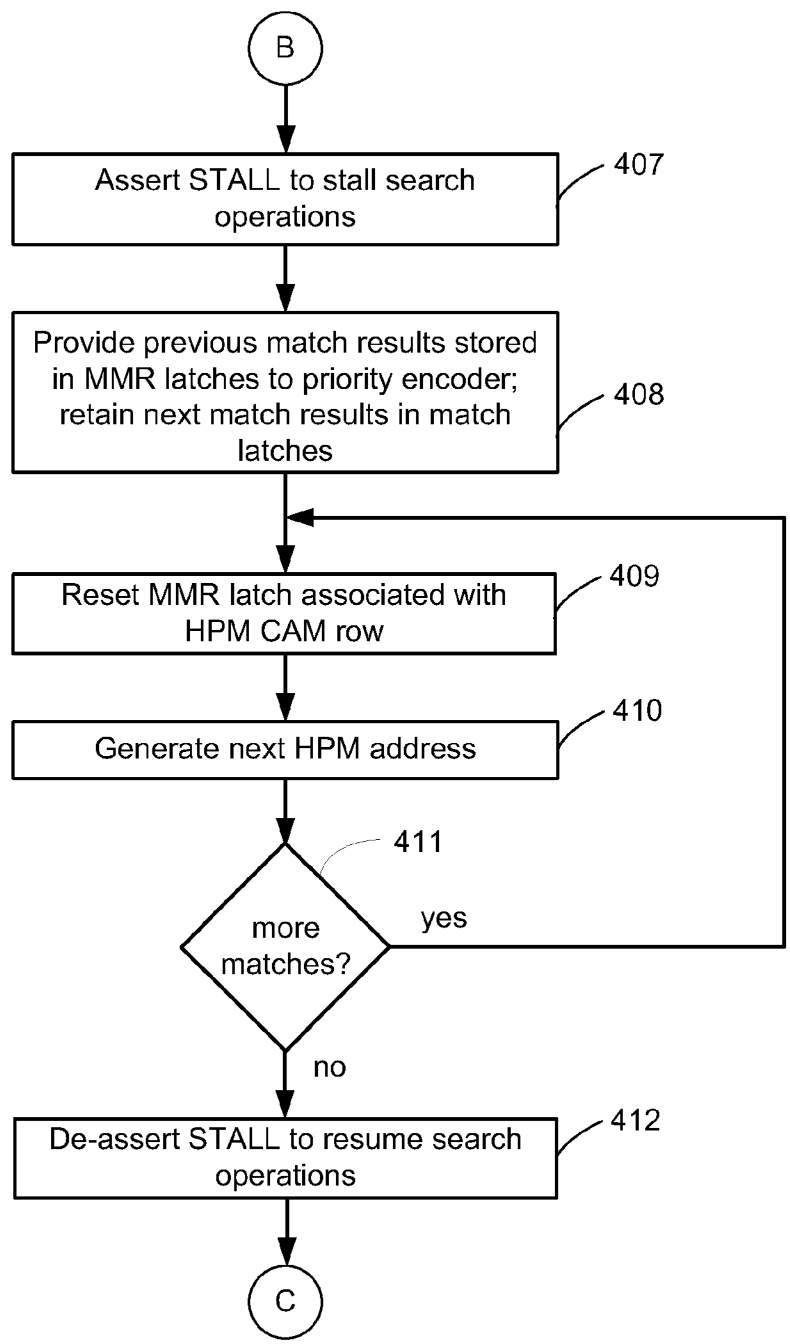

It should be noted that one or more of the steps described in FIGS. 4A and 4B as being performed at the same time may be performed in a concurrent, overlapping manner. For example, in step 405, the next compare operation may be commenced slightly before or after the priority encoder 170 begins generating the HPM address.

As described above, the present embodiments allow multiple matching addresses resulting from a first search operation in a CAM device to be generated without loss of match data resulting from a second search operation that was commenced prior to the detection of a multiple match condition for the first search operation. More specifically, when search operations are sequentially performed in a CAM device configured in accordance with present embodiments, the match results of a first search operation are latched in the match latches. The first match results are clocked into the MMR latches and provided to the multiple match detection circuit 150 and to the priority encoder 170. Then, while the multiple match detection circuit 150 uses the first match results to generate the MMF and the priority encoder 170 uses the first match results to generate the HPM address, a second search operation is commenced and the second match results are latched in the match latches. If there is a multiple match condition detected for the first search operation, the priority encoder 170 uses the first match results stored in the MMR latches to generate the addresses of multiple matching CAM locations while the MMR controller 180 stalls search operations in the CAM device (e.g., by asserting the signal STALL). Because the match results generated by the compare portion of the second search operation are stored in the match latches 212/310, and because the priority encoder 170 uses the first match results stored in separate MMR latches 321 to generate the addresses of the multiple matching CAM locations for the first search operation, the second match results are preserved during the stalled search operation while the first match results are used to generate the multiple matching addresses. Further, by using the HPM address to reset the corresponding MMR latch 321 prior to generating the next HPM address, present embodiments do not need an additional RNHPM instruction, an additional compare instruction, an additional write operations, or an additional compare operation to generate each next HPM address. This is in marked contrast to the CAM device disclosed in U.S. Patent No.

Figure 5:
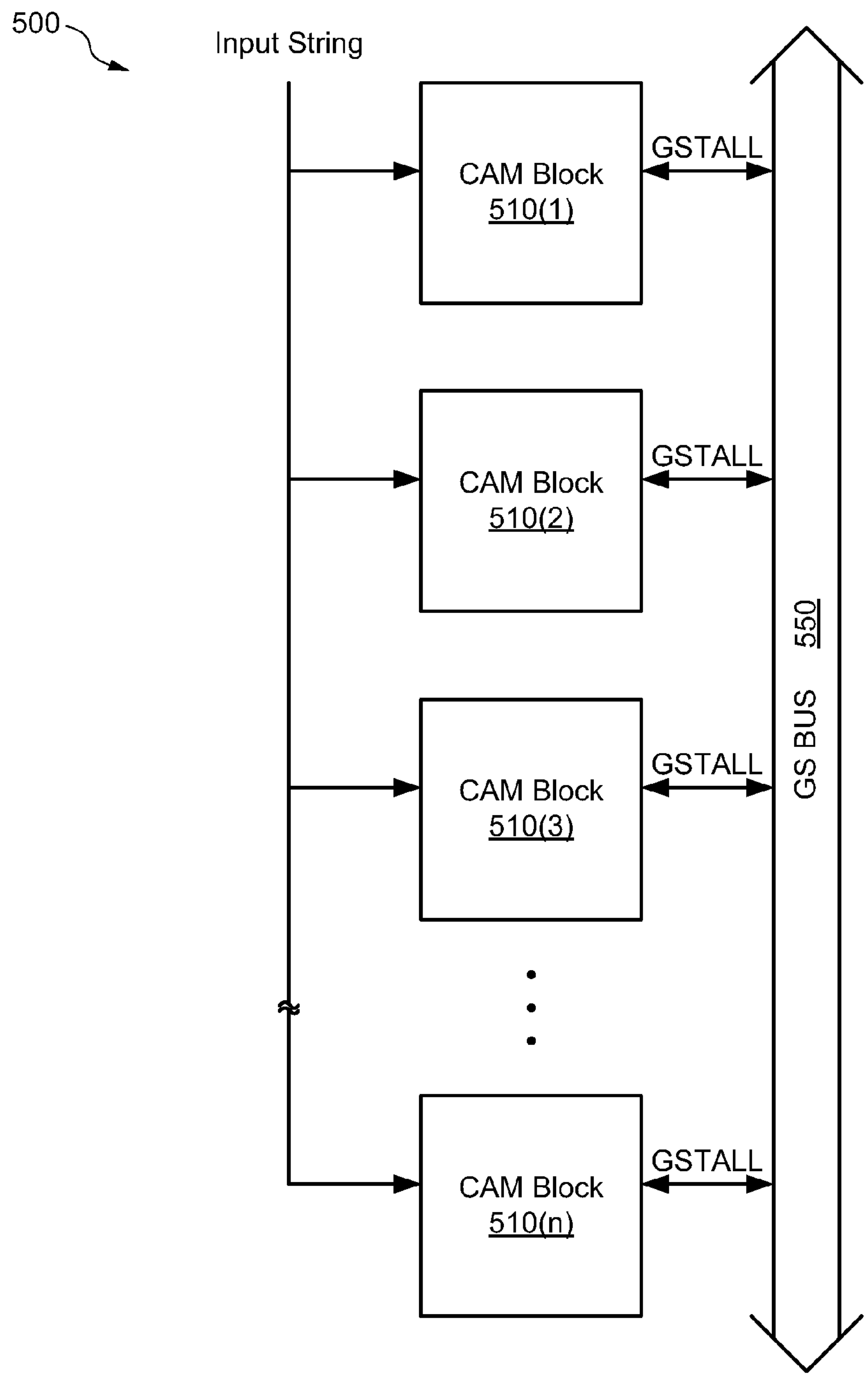
FIG. 5 illustrates a multi-block CAM device in accordance with some of the present embodiments.

FIG. 5 illustrates a multi-block CAM device 500 in accordance with some of the present embodiments. The CAM device 500 includes a number of CAM blocks 510(1)-510(*n*) each coupled to receive an input string. Each of the CAM blocks 510(1)-510(*n*) is also coupled to a global stall signal bus GS BUS 550. Each of the CAM blocks 510(1)-510(*n*) may further include circuitry similar to that described above with respect to CAM devices 100 and 200 of FIGS. 1 and 2, respectively. The CAM device 500 may have additional circuitry (not shown for simplicity) to receive one or more HPM indexes and/or match flags output from each of the CAM blocks 510(1)-**510(*n*) and to interface the HPM indexes with a controller or processor for the CAM device 500**.

More specifically, each of the CAM blocks 510(1)-**510(*n*) may include a separate CAM array and address decoder for storing data (e.g., CAM words). CAM blocks 510(1)-510(*n*) can store the same or different data. Although not shown for simplicity, each of the CAM blocks 510(1)-510(*n*) may output a corresponding HPM index and one or more match flags for each compare operation performed on the input string. Furthermore, matches detected within certain CAM blocks 510(1)-510(*n*) may be assigned a higher priority than matches detected within others of the CAM blocks 510(2)-510(*n*)**.

When performing search operations, the input string is searched by all of the CAM blocks 510(1)-**510(*n*) at the same time. Thus, when resolving multiple matches in any one of the CAM blocks 510(1)-510(*n*), it is desirable to stall compare operations in not only the CAM block performing the MMR operation but also in each of the other CAM blocks. This is accomplished by enabling each of the CAM blocks 510(1)-510(*n*) to transmit (or broadcast) a global stall signal GSTALL via GS PBUS 550 to all of the other CAM blocks 510(1)-510(*n*)** at the start of an MMR operation.

For example, if a multiple match condition is detection in CAM block 510(1), CAM block 510(1) stalls compare operations therein while the addresses of multiple matching locations are generated, and also asserts the signal GSTALL to stall compare operations in the other CAM blocks 510(2)-**510(*n*). Each of the CAM blocks 510(1)-510(*n*)** may include its own local controller that selectively stalls compare operations in response to receiving an asserted GSTALL signal.

Because of signal delays on GS BUS 550 and gate delays within the local controller within each CAM block, it is possible that the CAM blocks 510(2)-**510(*n*) do not stall on the same bit pattern of the input string as CAM block 510(1). For example, by the time the GSTALL signal reaches the CAM blocks 510(2)-510(*n*), subsequent compare operations in CAM blocks 510(2)-510(*n*) may have advanced further than the subsequent compare operation in CAM block 510(1). In this situation, it is desirable for CAM block 510(1) to process additional input characters upon completion of the local MMR operation so that compare operations in all CAM blocks 510(1)-510(*n*)** are synchronized with respect to the input characters.

Because the latency associated with block-to-block signaling are predictable, each of the CAM blocks 510(2)-**510(*n*) typically advances a predetermined number of input characters more than CAM block 510(1) when the GSTALL signal is received. Accordingly, the CAM block 510(1) may be configured to process a predetermined number of input characters upon completion of the MMR operation to "catch-up" with the other blocks 510(2)-510(*n*)**.

For some embodiments, when the CAM block 510(1) is ready to continue receiving subsequent input characters, CAM block 510(1) can broadcast a de-asserted GSTALL signal to the other CAM blocks CAM block 510(2)-**510(*n*) via the GS BUS 550. In response thereto, each of the CAM blocks 510** can simultaneously resume compare operations. To account for latency between CAM blocks, the global stall signal GSTALL can be de-asserted a predetermined time period (e.g., clock cycles) after de-assertion of the local stall signal STALL.

The multi-block CAM embodiments described herein provide several advantages over prior art CAM devices. For example, MMR operations may be performed within CAM device 500 at a local block level while maintaining synchronous input character comparisons between each of the CAM blocks 510(1)-**510(*n*). Furthermore, multiple MMR operations may be configured to take place concurrently within different CAM blocks 510(1)-510(*n*)** to increase bandwidth utilization and/or decrease latency in search operations using multiple CAM blocks.

Figure 6:
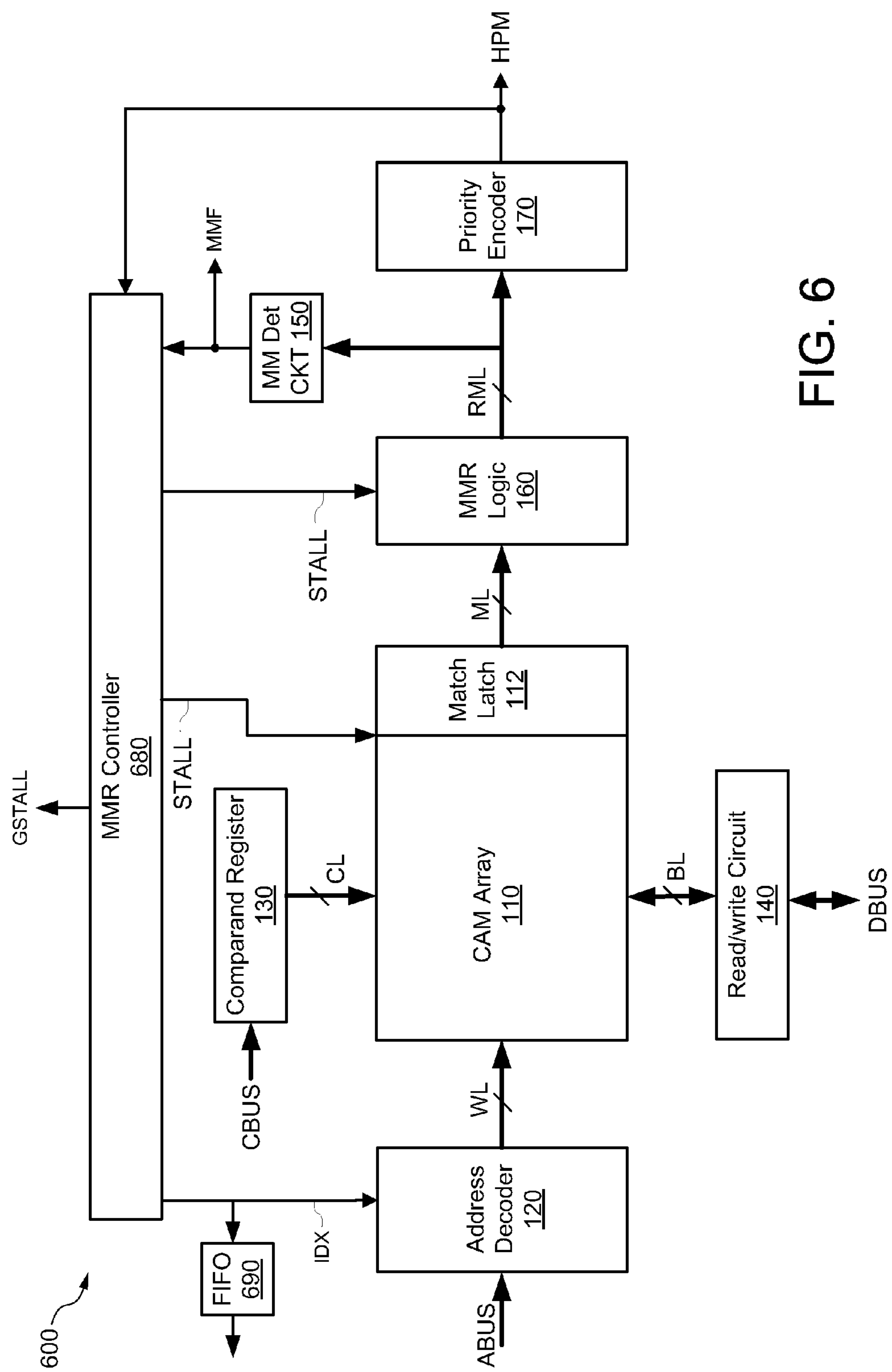
FIG. 6 illustrates a CAM block which is one embodiment of a CAM block shown in FIG. 5.

FIG. 6 shows a CAM block 600 that is one embodiment of CAM blocks 510 of FIG. 5. CAM device 600 includes a CAM array 110, a match latch 112, an address decoder 120, a comparand register 130, a read/write circuit 140, a multiple match detection circuit 150, multiple match resolution (MMR) logic 160, a priority encoder 170, an MMR controller 680, and FIFO 690. One or more instructions and related control signals can be provided to CAM device 100 from an instruction decoder (not shown for simplicity) to control read, write, compare, initialization, and other operations for CAM device 100. Other well-known signals that can be provided to CAM device 100, such as enable signals, clock and other timing signals, and power connections, are not shown in FIG. 1 for simplicity.

For some embodiments, the circuit elements (or components) of CAM block 600 may function in a similar manner to their counterpart components in CAM device 100, with the exception of MMR controller 680 and FIFO 690. The FIFO 690 facilitates the generation of local next highest priority match operations by buffering (or storing) the HPM indexes and/or match flags output by priority encoder 170. Referring also to FIG. 5, although multiple CAM blocks 510(1)-**510(*n*) may generate HPM indexes at the same time, an external bandwidth of the CAM device 500 may be limited. For example, a system-level controller of the CAM device 500 may only be able to receive and/or process one HPM index at a time. Thus, the matching indexes can be queued into the FIFO 690** to be read out whenever such external bandwidth is available.

Additionally, the FIFO 690 allows MMR operations to occur within multiple CAM blocks at the same time. For example, still referring to FIG. 5, multiple matches may be simultaneously detected within the CAM blocks 510(1) and 510(2). During a stall interval (e.g., an interval of time for which compare operations are stalled for all of the CAM blocks 510(1)-**510(*n*)), both of the CAM blocks 510(1) and 510(2) may then simultaneously perform respective MMR operations and load their resulting HPM indexes into local FIFO 690 until they can be output to the system-level controller for the CAM device 500. Although the FIFO 690** is herein described as a first-in first-out register, various other suitable forms of memory or data stores may be used in alternative embodiments.

In addition to performing functions described above with respect to MMR controller 180, MMR controller 680 includes additional circuitry for scheduling local MMR operations to take place within the CAM block 600 while a corresponding input string is concurrently searched across a plurality of other CAM blocks. For example, upon receiving an HPM index from priority encoder 170 and MMF from multiple match detection circuit 150, the MMR controller 680 may assert the local stall signal STALL and assert the global stall signal GSTALL for broadcast to one or more additional CAM blocks via the GS BUS 550 of FIG. 5. The assertion of STALL enables local MMR operations to generate the addresses of multiple matching CAM locations in the manner described above with respect to FIGS. 1-4, and the assertion of GSTALL stalls compare operations in other CAM blocks.

After the addresses of all the multiple matching CAM locations are generated, MMR controller 690 de-asserts GSTALL and, after a predetermined time period, de-asserts STALL. The predetermined time period between de-assertion of GSTALL and STALL allows the CAM block 600 to process a selected number of additional input characters to catch up to the other CAM blocks.

Figure 7:
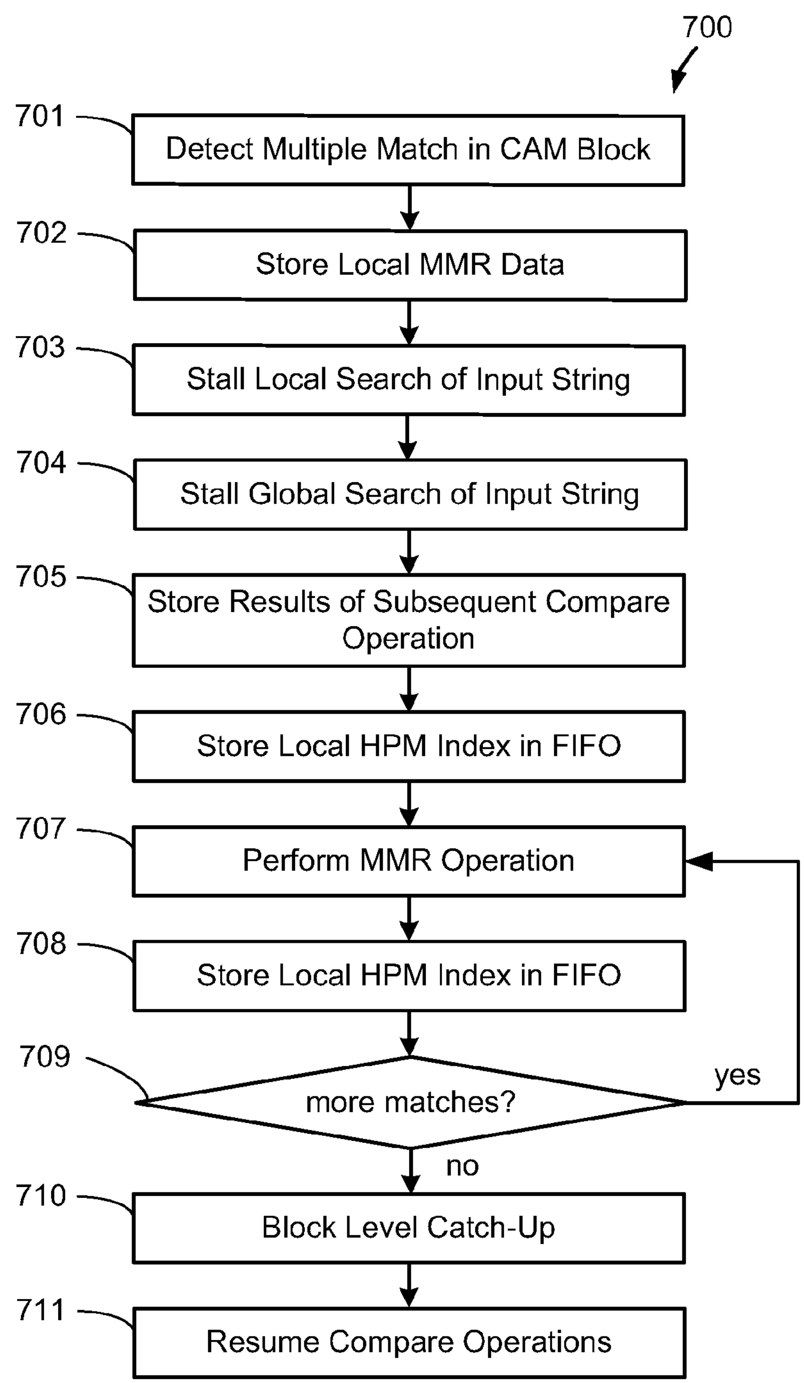
FIG. 7 illustrates an exemplary MMR operation for resolving multiple match detections within a local CAM block during concurrent compare operations in a plurality of CAM blocks.

FIG. 7 illustrates an exemplary operation 700 for resolving multiple match detections within a local CAM block while performing compare operations in other CAM blocks at the same time. For purposes of discussion, the term "local" is used herein to describe signals, circuitry, and/or operations that are local to the CAM block in which the MMR operation 700 is performed. First, a multiple match condition is detected within a particular CAM block (701). Then, MMR data associated with the current compare operation in the local CAM block is stored (702). For example, the MMR data may be stored in the local MMR latches 321 (see also FIG. 3).

Next, the local compare operation is stalled in response to the multiple match condition (703). For example, MMR controller 680 may assert the local stall signal STALL, as described above with respect to FIGS. 4A-4B. Then, compare operations in other CAM blocks are stalled (704). For example, MMR controller 680 may assert the global stall signal GSTALL to signal the other CAM blocks to stall compare operations therein. The match results from a subsequent compare operation in the local CAM block are then stored (705). For example, the match results from the subsequent compare operation may be stored in the match latches 212 (see also FIG. 2). Then, a local HPM index determined by the local CAM block is stored in a memory register (e.g., a FIFO) (706). For example, upon receiving a HPM index output by the priority encoder 670 in association with the multiple match flag, MMR controller 680 may load the HPM index into the FIFO 690 to be output when external bandwidth is available.

Then, an MMR operation is performed to generate the next highest priority matching address in the manner described above with respect to FIGS. 4A-4B (707). The HPM address is then stored (708). For example, MMR controller 680 may provide the received HPM address to the local FIFO register 690 to be queued for output from the CAM block when external bandwidth is available.

If there are remaining matches, as tested as 709, processing continues at 707 to generate the address of the next highest-priority matching CAM location. Otherwise, a block level catch-up operation is performed to advance the search operation within the local CAM block to be substantially aligned with search operations in the other CAM blocks in the CAM device. For example, if the other CAM blocks process two input characters more than the current CAM block at the time their respective search operations were stalled, then the local CAM block is configured to process two additional input characters during step 710. For some embodiments, the block level catch-up operation may be performed for a predetermined duration of time. Alternatively, the block level catch-up operation may run for a predetermined number of compare cycles. Finally, compare operations are resumed for the entire CAM device (711). For example, MMR controller 680 may de-assert the global stall signal GSTALL to enable all of the CAM blocks within the CAM device to resume compare operations.

Note that if a multiple match condition is detected at any time during execution of steps 709 or 710, selected steps of the operation 700 may be repeated to generate any and/or all of the multiple match addresses. More specifically, steps 702 and 706-709 of the operation 700 may be repeated until the addresses of all multiple matching locations are generated. Further, although steps 702-705 are described in a sequential manner, they may be performed concurrently or at substantially the same time (e.g., to increase the bandwidth usage and/or reduce the latency of the overall CAM system while processing a consecutive sequence of bit patterns). The operation 700 (or at least selected parts of it) may thus be repeated any time a multiple match is detected for the duration of the string search operation. Although the operation 700 has been described with respect to a single CAM block of a plurality of CAM blocks, the same operation may be performed by two or more CAM blocks concurrently.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A content addressable memory (CAM) device, comprising:

a CAM array including a plurality of rows, each row of the plurality of rows including one or more CAM cells coupled to a match line of a plurality of match lines;

a multiple match detection circuit coupled to the plurality of match lines configured output to generate a multiple match signal for a first compare operation;

a priority encoder;

a plurality of multiple match resolution (MMR) circuits configured to store a match result from the first compare operation;

a plurality of match latches configured to store a match result from a second compare operation that commenced prior to generation of the multiple match signal for the first compare operation; and an MMR controller configured to generate a stall signal that selectively stalls search operations in the CAM array in response to the multiple match signal indicating that a multiple match condition is detected, wherein the plurality of MMR circuits is further configured to forward the match result from the first compare operation to the priority encoder when the stall signal is in a first state, and the plurality of match latches are configured to forward the match result from the second compare operation to the priority encoder when the stall signal is in a second state.

2. The CAM device of claim 1, wherein each of the plurality of match latches is coupled to a corresponding match line of the plurality of match lines; and wherein each of the plurality of MMR circuits is coupled to a corresponding match latch of the plurality of match latches, a second input configured to receive the stall signal, and an output configured to generate a resolved match signal.

3. The CAM device of claim 2, further comprising:

a word line coupled to an address decoder and to a reset terminal of a corresponding MMR circuit of the plurality of MMR circuits;

a local word line coupled to the one or more CAM cells in a corresponding row of the plurality of rows; and an AND gate, coupled to the word line and the local word line, configured to receive a select signal.

4. The CAM device of claim 2, wherein the priority encoder is coupled to the plurality of MMR circuits, and is configured to generate an index of a highest priority match (HPM) in the CAM array.

5. The CAM device of claim 4, wherein the MMR controller is further configured to provide the index of the HPM as an address to the CAM array to determine a next highest priority match index for a selected compare operation.

6. The CAM device of claim 5, wherein the next highest priority match index is generated without an additional compare operation.

7. The CAM device of claim 5, wherein the next highest priority match index is generated without an additional instruction.

8. The CAM device of claim 2, wherein each MMR circuit of the plurality of MMR circuits comprises:

a corresponding MMR latch of a plurality of MMR latches, coupled to the corresponding match latch, configured to receive a clock signal; and a multiplexer, coupled to the corresponding MMR latch and to the corresponding match latch, configured to receive the stall signal and to generate the resolved match signal based upon the stall signal.

9. The CAM device of claim 8, wherein each MMR latch of the plurality of MMR latches further comprises:

a reset input coupled to a word line.

10. The CAM device of claim 9, further comprising:

a local word line coupled to the one or more CAM cells in a corresponding row of the plurality of rows; and an AND gate, coupled to the word line and to the local word line, configured to receive a select signal.

11. A content addressable memory (CAM) device, comprising:

a CAM array including a plurality of rows, each row of the plurality of rows including one or more CAM cells coupled to a corresponding match line of a plurality of match lines;

a plurality of match latches, each match latch of the plurality of match latches being coupled to a corresponding match line of the plurality of match lines;

a priority encoder; and a plurality of multiple match resolution (MMR) circuits, each MMR circuit of the plurality of MMR circuits comprising:

a corresponding MMR latch of a plurality of MMR latches, coupled a corresponding match latch of the plurality of match latches, configured to receive a clock signal and to store a match result from a first compare operation; and a multiplexer, coupled to the MMR latch and to the corresponding match latch, configured to receive a stall signal generated in response to when a multiple match signal indicates that a multiple match condition is detected for the first compare operation and to generate a resolved match signal, wherein the plurality of match latches is configured to store a match result from a second compare operation that commenced prior to generation of the multiple match signal for the first compare operation, and wherein the plurality of MMR circuits is configured to forward the match result from the first compare operation to the priority encoder when the stall signal is in a first state, and the plurality of match latches are configured to forward the match result from the second compare operation to the priority encoder when the stall signal is in a second state.

12. The CAM device of claim 11, wherein the priority encoder, is coupled to the plurality of MMR circuits, and is configured to generate an index of a highest priority match (HPM) in the CAM array.

13. The CAM device of claim 11, further comprising:

an MMR controller configured to drive the stall signal to an asserted state that stalls a next compare operation in the CAM array when the multiple match condition is detected in a previous compare operation.

14. The CAM device of claim 11, further comprising:

a word line coupled to an address decoder and to a reset terminal of a corresponding MMR latch of the plurality of MMR latches;

a local word line coupled to the one or more CAM cells in a corresponding row of the plurality of rows; and an AND gate, coupled to the word line and to the local word line, configured to receive a select signal.

15. The CAM device of claim 14, wherein the priority encoder is coupled to the plurality of MMR circuits and configured to generate an index of a highest priority matching (HPM) row in the CAM array; and further comprising:

an MMR controller configured to provide the HPM row index as an address to the address decoder to determine a next highest priority match index for a selected compare operation.

16. The CAM device of claim 15, wherein the MMR controller is further configured to assert the select signal and the stall signal in response to detection of the multiple match condition.

17. The CAM device of claim 15, wherein the HPM row index causes the address decoder to assert the word line of the HPM row, and wherein the asserted word line resets the output of the MMR latch associated with the HPM row.

18. A method of generating addresses of multiple matching locations during pipelined search operations in a content addressable memory (CAM) array, comprising:

comparing a first search key with data stored in the CAM array to generate a first match result in a first search operation;

latching the first match result in a plurality of match latches and in a plurality of multiple match resolution (MMR) circuits;

initiating a second search operation, prior to generation of a multiple match signal for the first compare operation, in the CAM array to generate a second match result;

asserting a stall signal in response to when the multiple match signal for the first search operation indicates that a match is detected;

stalling the second search operation in response to the asserted stall signal;

forwarding the first match result from the first compare operation to a priority encoder when the stall signal is in a first state; and forwarding the second match result from a second compare operation to the priority encoder when the stall signal is in a second state.

19. The method of claim 18, further comprising:

latching the second match results in the plurality of match latches;

selecting the plurality of MMR circuits to forward the first match result to the priority encoder if the stall signal is asserted; and generating an index of a highest priority match (HPM) in response to the first match result.

20. The method of claim 19, further comprising:

providing the HPM index to an address decoder;

asserting a word line corresponding to a corresponding row, of a plurality of rows of the CAM device, whose match was detected in response to the HPM index; and resetting a corresponding MMR circuit, of the plurality of MMR circuits, in the corresponding row in response to the asserted word line.

21. The method of claim 20, further comprising:

providing an updated first match result from the plurality of MMR circuits to the priority encoder; and generating an index of a next HPM in response to the updated first match result.

22. The method of claim 21, wherein the next HPM index is generated without an additional compare operation.

23. The method of claim 21, wherein the next HPM index is generated without an additional instruction.

24. A content addressable memory (CAM) device including an array of CAM cells, comprising:

means for comparing a first search key with data stored in the CAM array to generate first match result in a first search operation;

means for latching the first match result in a plurality of match latches and in a plurality of multiple match resolution (MMR) circuits;

means for initiating a second search operation, prior to generation of a multiple match signal for the first search operation, in the CAM array to generate a second match result;

means for asserting a stall signal in response to when a multiple match condition for the first search operation indicates that a multiple match condition is detected;

means for stalling the second search operation in response to the asserted stall signal;

means for forwarding the first match result from the first search operation to a priority encoder when the stall signal is in a first state, and means for forwarding the second match result from a second compare operation to the priority encoder when the stall signal is in a second state.

25. The CAM device of claim 24, further comprising:

means for latching the second match result in the plurality of match latches;

means for selecting the plurality of MMR circuits to forward the first match result to means for generating addresses if the stall signal is asserted; and means for generating an index of a highest priority match (HPM) in response to the first match result.

26. The CAM device of claim 25, further comprising:

means for providing the HPM index to an address decoder;

means for asserting a word line corresponding to a corresponding row of a plurality rows of the CAM device, whose match was detected in response to the HPM index; and means for resetting a corresponding MMR circuit, of the plurality of MMR circuits, in the corresponding row in response to the asserted word line.

27. The CAM device of claim 26, further comprising:

means for providing an updated first match result from the plurality of MMR circuits to the means for generating addresses; and means for generating an index of a next HPM in response to the updated first match result.

28. The CAM device of claim 27, wherein the next HPM index is generated without an additional compare operation.

29. The CAM device of claim 27, wherein the next HPM index is generated without an additional instruction.

* * * * *

UNITED STATES PATENT AND TRADEMARK OFFICE

CERTIFICATE OF CORRECTION

PATENT NO. : 9,063,840 B1
APPLICATION NO. : 12/715083
DATED : June 23, 2015
INVENTOR(S) : Deshpande et al.

It is certified that error appears in the above-identified patent and that said Letters Patent is hereby corrected as shown below:

In the claims

In column 14, line 40, replace “a match” with --a corresponding match--.
In column 14, line 41, replace “circuit coupled” with --circuit, coupled--.
In column 14, line 42, replace “lines configured output to” with --lines, configured to--.
In column 14, line 46, replace “a match” with --a first match--.
In column 14, line 48, replace “a match” with --a second match--.
In column 14, line 57, replace “the match” with --the first match--.
In column 14, line 59, replace “and the” with --and wherein the--.
In column 14, line 59, replace “are configured” with --is further configured--.
In column 14, line 60, replace “the match” with --the second match--.
In column 15, line 57, replace “coupled a” with --coupled to a--.
In column 15, line 59, replace “a match” with --a first match--.
In column 15, line 60, replace “the MMR” with --the corresponding MMR--.
In column 15, line 67, replace “a match” with --a second match--.
In column 16, line 4, replace “the match” with --the first match--.
In column 16, line 6, replace “and the” with --and wherein the--.
In column 16, lines 6-7, replace “are configured” with --is further configured--.
In column 16, line 7, replace “the match” with --the second match--.
In column 16, line 11, replace “encoder, is” with --encoder is--.
In column 16, line 31, replace “matching” with --match--.
In column 16, lines 33-34, replace “the HPM row index” with --the index of the HPM row--.
In column 16, lines 41-42, replace “the HPM row index” with --the index of the HPM row--.
In column 16, line 42, replace “the word” with --a word--.
In column 16, line 43, replace “resets the” with --resets a--.
In column 16, line 55, replace “the first” with --a first--.
In column 17, line 2, replace “results” with --result--.
In column 17, line 10, replace “the HPM index” with --the index of the HPM--.
In column 17, line 30, replace “the CAM array” with --the array of CAM cells--.

Signed and Sealed this
Twenty-second Day of December, 2015

Michelle K. Lee

Michelle K. Lee
*Director of the United States Patent and Trademark Office*

In the claims

In column 17, line 37, replace “the CAM array” with --the array of CAM cells--.
In column 18, line 20, replace “the HPM index” with --the index of the HPM--.
In column 18, line 22, replace “plurality rows” with --plurality of rows--.
In column 18, lines 23-24, replace “the HPM index” with --the index of the HPM--.